United States Patent
Woll et al.

(10) Patent No.: US 11,442,112 B2
(45) Date of Patent: Sep. 13, 2022

(54) METHOD FOR DETERMINING AT LEAST ONE AGING STATE OF A FIRST PLURALITY OF ELECTRICAL ENERGY STORE UNITS

(71) Applicant: Robert Bosch GmbH, Stuttgart (DE)

(72) Inventors: Christoph Woll, Gerlingen (DE); Christian Simonis, Leonberg (DE); Volker Doege, Dischingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 17/193,044

(22) Filed: Mar. 5, 2021

(65) Prior Publication Data
US 2021/0286016 A1 Sep. 16, 2021

(30) Foreign Application Priority Data
Mar. 5, 2020 (DE) .......................... 102020202802.8

(51) Int. Cl.
*G01R 31/392* (2019.01)
*G01R 31/396* (2019.01)
*H02J 7/00* (2006.01)

(52) U.S. Cl.
CPC ......... *G01R 31/392* (2019.01); *G01R 31/396* (2019.01); *H02J 7/0014* (2013.01)

(58) Field of Classification Search
CPC .. G01R 31/007; G01R 31/392; G01R 31/396; G01R 31/3835; H02J 7/0014; H02J 7/005; Y02E 60/10
See application file for complete search history.

(56) References Cited

U.S. PATENT DOCUMENTS

| 5,675,258 | A | 10/1997 | Kadouchi et al. |
| 2020/0284846 | A1* | 9/2020 | Pajovic ............. H01M 10/4285 |

FOREIGN PATENT DOCUMENTS

| KR | 20150084354 | * | 7/2015 |
| KR | 20150084354 | A | 7/2015 |
| WO | WO 2012124845 | * | 9/2012 |

* cited by examiner

*Primary Examiner* — Catherine T. Rastovski
(74) *Attorney, Agent, or Firm* — Norton Rose Fulbright US LLP; Gerard Messina

(57) ABSTRACT

A method for determining at least one aging state of a first plurality of electrical energy store units. The method includes: a) ascertaining the number of balancing operations already carried out between the first plurality of electrical energy store units within a predefined first time interval and/or the total converted energy quantity during a balancing operation between the first plurality of electrical energy store units and/or a first measure of dispersion of a particular state of charge-characterizing parameter of the first plurality of electrical energy store units; b) determining the at least one aging state of the first plurality of electrical energy store units as a function of the number of balancing operations already carried out and/or as a function of the total converted energy quantity during a balancing operation and/or as a function of the first measure of dispersion.

9 Claims, 3 Drawing Sheets

METHOD FOR DETERMINING AT LEAST ONE AGING STATE OF A FIRST PLURALITY OF ELECTRICAL ENERGY STORE UNITS

CROSS REFERENCE

The present application claims the benefit under 35 U.S.C. § 119 of German Patent Application No. DE 102020202802.8 filed on Mar. 5, 2020, which is expressly incorporated herein by reference in its entirety.

FIELD

The present invention is directed to a method for determining at least one aging state of a first plurality of electrical energy store units.

BACKGROUND INFORMATION

As the result of increasing electrification, in particular in the vehicular and automotive sector, mobile electrical energy store systems are being increasingly used. In particular with the ever-growing use of lithium ion technology, adherence to predefined limiting values, for example voltage and state of charge limiting values, is necessary to ensure the reliability and service life of the electrical energy store system. In addition, in particular for users of these electrical energy store systems, an accurate knowledge of the capacity, i.e., the storage capability, of the electrical energy store units of the electrical energy store system in question is relevant. The instantaneous capacity is a characteristic value for the aging state of an electrical energy store unit. For this purpose, corresponding updates of the capacity values of the electrical energy store units are carried out by a battery management system, usually at irregular intervals. With the aid of these capacity values, for example a remaining cruising range of an electrically driven vehicle may be displayed to a user. The more frequently it is possible for these updates to be carried out, the more accurately the vehicle cruising range may be displayed to the user. In addition, the accuracy of a mathematical model used for capacity ascertainment may be improved via appropriate feedback. The ascertained capacity value may, for example, be set in relation to a reference capacity value in order to ascertain a corresponding aging coefficient, also referred to as state of health (SOH). Thus, it is also possible to easily ascertain an instantaneous capacity value from the aging coefficient with the aid of multiplication by the reference value.

Korea Patent Application No. KR20150084354 describes a device for estimating an aging coefficient, based on a balancing operation.

SUMMARY

A method for determining at least one aging state of a first plurality of electrical energy store units, is provided in accordance with an example embodiment of the present invention. The aging state characterizes the first plurality of electrical energy store units as an overall system, not on the level of individual electrical energy store units.

In accordance with an example embodiment of the present invention, the number of balancing operations already carried out between the first plurality of electrical energy store units within a predefined first time interval is ascertained. Alternatively or additionally, the total converted energy quantity during a balancing operation between the first plurality of electrical energy store units is ascertained. Alternatively or additionally, a first measure of dispersion of a particular state of charge-characterizing parameter of the first plurality of electrical energy store units is ascertained. The parameters may, for example, be the state of charge values and/or the terminal voltage values of the electrical energy store units, the first measure of dispersion being the standard deviation, for example.

The at least one aging state of the first plurality of electrical energy store units is determined as a function of the number of balancing operations already carried out and/or as a function of the total converted energy quantity during a balancing operation and/or as a function of the first measure of dispersion.

The method is advantageous due to the fact that it may be easily implemented, and due to the utilization of balancing operations that normally take place anyway, does not impose great demands on computing power or memory requirements. In addition, it is applicable for any type of electrical energy store units between which balancing operations occur.

The method may be implemented by computer, for example.

Further advantageous specific embodiments of the present invention are described herein.

A reference model is advantageously provided which is used for determining the at least one aging state of the first plurality of electrical energy store units, and used in the above-described determination of the at least one aging state. The model includes at least one relationship between the number of balancing operations already carried out and/or the total converted energy quantity during a balancing operation and/or the first measure of dispersion, as well as the at least one aging state. This relationship may be stored, for example, in a characteristic map in a data memory. This is advantageous due to the fact that this relationship may be ascertained from reference measurements that are carried out on a test stand, for example. Different driving profiles and standstill times may be easily taken into account, so that a utilization behavior together with associated aging may be considered in a detailed manner.

The need for a balancing operation is advantageously checked based on a second measure of dispersion of the parameters of the first plurality of electrical energy store units which characterize a particular state of charge. Depending on the check, a balancing operation is then optionally initiated, for example when a predefined value of the second measure of dispersion is exceeded. The second measure of dispersion may be the range, for example, and may be computed as the difference between the largest and the smallest parameter value, for example the largest and smallest voltage value, of the first plurality of electrical energy store units. This is advantageous due to the fact that the self-discharge (primarily as the result of long-term parkers, for example) and the cyclical discharging/charging operations (primarily as the result of long-distance drivers, for example) are incorporated to the same extent into the evaluation of the balancing operations.

The total converted energy quantity during the balancing operation between the first plurality of electrical energy store units is advantageously ascertained at least as a function of a balancing resistance, a particular terminal voltage of the first plurality of electrical energy store units, and a duration of the balancing operation. This is advantageous due to the fact that the energy quantity converted during the balancing increases with increasing aging, and therefore is a good measure for the aging. The energy quantity may be reliably ascertained based on the indicated variables. The balancing resistance is typically known, and the terminal voltage as well as the duration of the balancing operation may be ascertained.

The first measure of dispersion is advantageously selected as the standard deviation. This is advantageous due to the fact that it may be easily computed, and is of great importance as a significant parameter of the normal distribution, which numerous processes follow.

In accordance with an example embodiment of the present invention, the first plurality of electrical energy store units is advantageously divided into clusters based on a variable characterizing the utilization, in particular their total charging throughput. Another possible variable here is the previous total covered distance, for example for use in vehicles. A division into frequently used and less frequently used energy store units may thus be advantageously carried out. In addition, the above-mentioned method steps are correspondingly carried out for each of the clusters, the predefined first time interval and/or the reference model possibly being different, depending on the cluster. This is advantageous to be able to satisfactorily cover the different utilization cases, since a different aging behavior may occur, depending on the utilization. In addition, for frequently used and less frequently used electrical energy store units, different reference models may be provided which cover the particular aging behavior even better. This may be appropriately ascertained via laboratory experiments or also fleet data.

Moreover, the present invention includes a device for determining at least one aging state of a first plurality of electrical energy store units, including at least one apparatus that is configured to carry out the steps of the method according to one of the example embodiments of the present invention.

The at least one apparatus may include a battery management control unit and/or current sensors and/or voltage sensors and/or temperature sensors, for example. In addition, an electronic control unit, in particular in the form of a battery management control unit, may be such an apparatus.

An electronic control unit may be understood in particular to mean an electronic control unit that includes, for example, a microcontroller and/or an application-specific hardware component such as an ASIC, but may also be understood to mean a personal computer or server system or a memory-programmable controller.

Moreover, the present invention includes a computer program that is configured to execute all steps of the provided method(s). The stated advantages may be achieved in this way.

Furthermore, the present invention includes a machine-readable memory medium on which the computer program is stored. This is advantageous in order to permanently store the computer program, in addition to the stated advantages.

Moreover, the present invention includes an electrical energy store system that includes at least two electrical energy store units together with an associated balancing unit for balancing the energy store units, as well as the device mentioned above.

An electrical energy store unit may be understood in particular to mean an electrochemical battery cell and/or a battery module that includes at least one electrochemical battery cell, and/or a battery pack that includes at least one battery module. For example, the electrical energy store unit may be a lithium-based battery cell or a lithium-based battery module or a lithium-based battery pack. In particular, the electrical energy store unit may be a lithium-ion battery cell or a lithium-ion battery module or a lithium-ion battery pack. Furthermore, the battery cell may be a lithium-polymer rechargeable battery, nickel-metal hydride rechargeable battery, lead-acid rechargeable battery, lithium-air rechargeable battery, or lithium-sulfur rechargeable battery, or in general may be a rechargeable battery of an arbitrary electrochemical composition.

The first plurality may be a battery pack or a battery system, for example, and the second plurality may include multiple such battery packs.

BRIEF DESCRIPTION OF THE DRAWINGS

Advantageous specific embodiments of the present invention are illustrated in the figures and explained in greater detail below.

DETAILED DESCRIPTION OF EXAMPLE EMBODIMENTS

Figure 1:
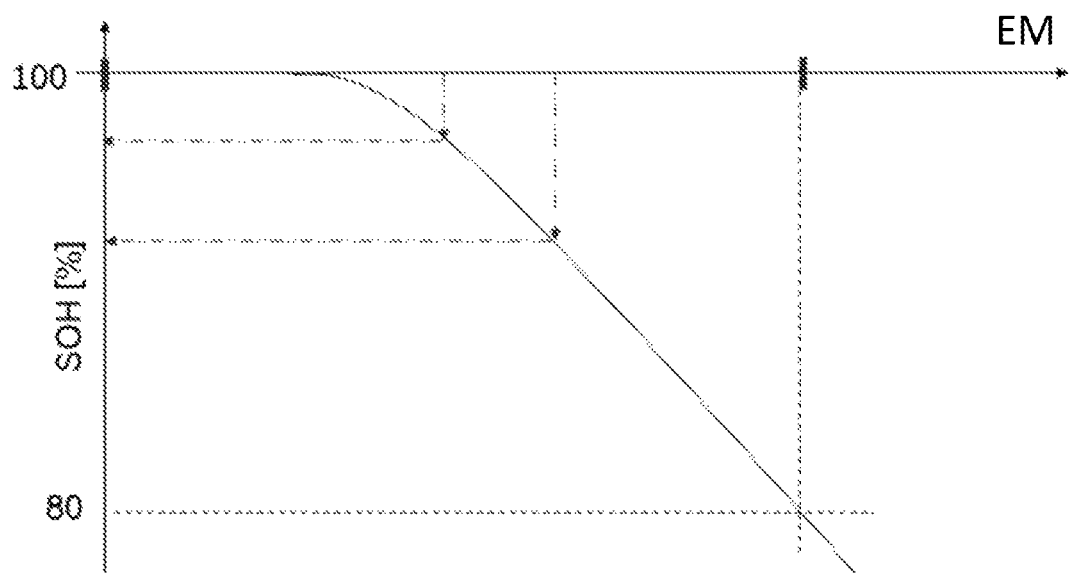
FIG. 1 shows a schematic illustration of the dependency of an aging state of a first plurality of electrical energy store units on an energy quantity that is converted during a balancing operation between the first plurality of electrical energy store units.

Identical device components or identical method steps are denoted by the same reference numerals in all figures.

FIG. 1 shows a schematic illustration of the dependency of an aging state of a first plurality of electrical energy store units on an energy quantity that is converted during a balancing operation between the first plurality of electrical energy store units.

An aging state, also referred to as state of health (SOH), of the first plurality of electrical energy store units is plotted on the ordinate axis, which extends vertically downward. The aging state represents, for example, an instantaneous capacity of the first plurality of electrical energy store units relative to a reference value, the reference value being, for example, the capacity at the start of utilization of the electrical energy store units. The instantaneous capacity may thus be ascertained from the aging state.

Total converted energy quantity EM during a balancing operation between the first plurality of electrical energy store units is plotted on the abscissa axis. It is apparent from the illustration that the aging state deteriorates with an increasingly converted energy quantity, and the capacity therefore decreases. This results from more or less severe aging of the electrical energy store units. At the start of their utilization, their capacity values are still close to one another, but drift apart over time. The need for balancing and the energy quantity that is converted during the balancing, for example converted into heat, thus increase. Alternatively, the energy quantity that is exchanged between the electrical energy store units may be understood as the energy quantity that is converted during the balancing, if active balancing is used.

For an SOH of 80%, the end of the utilization time is typically reached for a use in vehicles.

Figure 2:
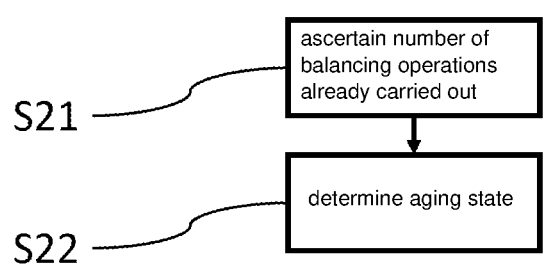
FIG. 2 shows a flowchart of a method according to the present invention according to a first specific embodiment.

FIG. 2 shows a flowchart of a method according to the present invention according to a first specific embodiment, which is used for determining at least one aging state of a first plurality of electrical energy store units.

The number of balancing operations that are already carried out between the first plurality of electrical energy store units is ascertained within a predefined first time interval in a first step S21. Alternatively and/or additionally, the total converted energy quantity during a balancing operation between the first plurality of electrical energy store units may be ascertained.

Alternatively and/or additionally, a first measure of dispersion of a particular state of charge-characterizing parameter, for example a standard deviation of the terminal voltages of the electrical energy store units in question, may be ascertained.

The aging state of the first plurality of electrical energy store units is determined in a second step S22 as a function of the number of balancing operations already carried out. Alternatively and/or additionally, the further ascertained variables may optionally be incorporated into this determination.

Figure 3:
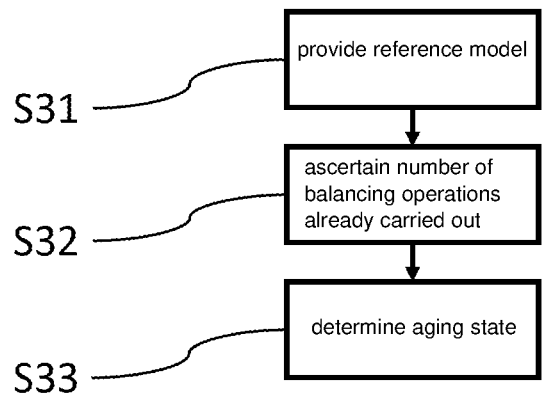
FIG. 3 shows a flowchart of a method according to the present invention according to a second specific embodiment.

FIG. 3 shows a flowchart of a method according to the present invention according to a second specific embodiment, which is used for determining at least one aging state of a first plurality of electrical energy store units.

A reference model for determining the at least one aging state of the first plurality of electrical energy store units, which includes the at least one relationship between the number of balancing operations already carried out within the first predefined time interval, as well as the at least one aging state, is provided in a first step S31. Alternatively and/or additionally, the reference model may include a relationship between the total converted energy quantity during a balancing operation and/or the first measure of dispersion, as well as the at least one aging state.

In addition, second step S32 corresponds to first step S21 described above.

Third step S33 corresponds in part to second step S22 described above, the determination of the at least one aging state in third step S33 taking place with the aid of the provided reference model.

Figure 4:
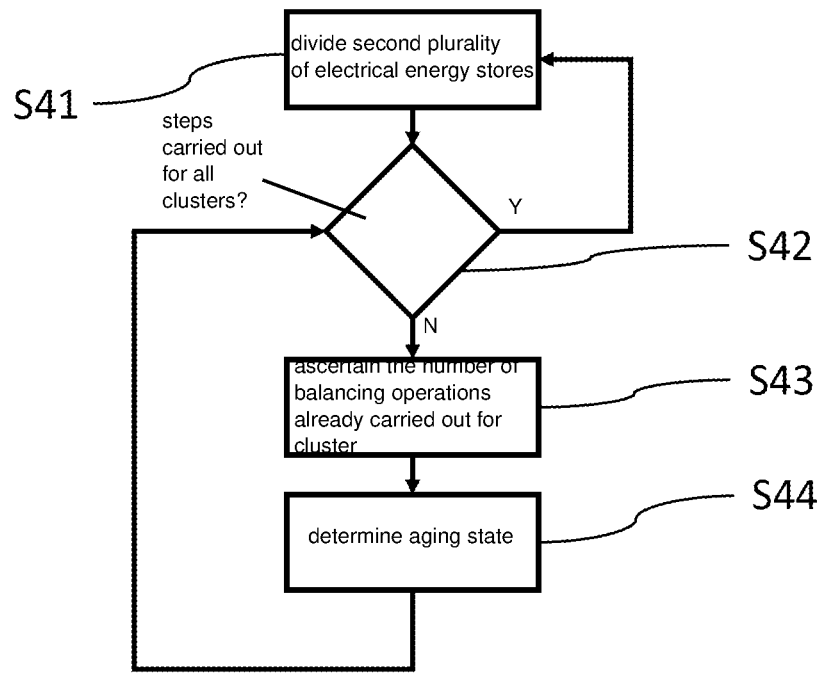
FIG. 4 shows a flowchart of a method according to the present invention according to a third specific embodiment.

FIG. 4 shows a flowchart of a method according to the present invention according to a third specific embodiment, which is used for determining at least one aging state of a first plurality of electrical energy store units.

A second plurality of electrical energy store units is divided into clusters, based on a variable that characterizes the utilization, in a first step S41. The second plurality includes the first plurality. For example, battery packs are divided into clusters. The variable that characterizes the utilization may include, for example, a charge throughput of the electrical energy store units, or the previously total covered distance when the electrical energy store units are used in a vehicle. A division into frequently used and less frequently used energy store units is thus possible, the energy store units always being jointly associated with a cluster based on their belonging to the first plurality of electrical energy store units, for example. The number of clusters may be set based on the application, for example to the number three: frequent user, infrequent user, average user.

A check is made in a second step S42 as to whether the corresponding method steps have already been carried out for all clusters. If the answer is no, the method continues with third step S43, in which the next cluster not yet processed is processed, for example the first cluster. If the answer is yes, first step S41 may be started again, for example after a certain wait time.

The number of balancing operations already carried out between the plurality of electrical energy store units within a predefined first time interval is ascertained in third step S43 for the cluster in question or for the plurality of electrical energy store units belonging to the cluster. For example, if two battery packs belong to the cluster in question, the corresponding number of balancing operations is ascertained for each of the battery packs belonging to the cluster. The predefined first time interval may be set differently, depending on the cluster. Alternatively and/or additionally, the total converted energy quantity during a balancing operation between the plurality of electrical energy store units may be ascertained.

Alternatively and/or additionally, a first measure of dispersion of a particular state of charge-characterizing parameter, for example a standard deviation of the terminal voltages of the electrical energy store units in question, may be ascertained. This takes place once again, for example, for each of the battery packs belonging to the cluster.

The aging state of the plurality of electrical energy store units is determined in a fourth step S44 for the cluster in question as a function of the number of balancing operations already carried out. Alternatively and/or additionally, the further ascertained variables may optionally be incorporated into this determination. This takes place once again, for example, for each of the battery packs belonging to the cluster. Thus, a corresponding aging state is present for each battery pack. The method subsequently continues with second step S42.

The method may be carried out in particular on a network server or in the cloud, the ascertainment steps being carried out via a corresponding computer network, for example, in order to query the data in question. The battery packs may be connected to the server or the cloud via wireless network connections, for example.

Figure 5:
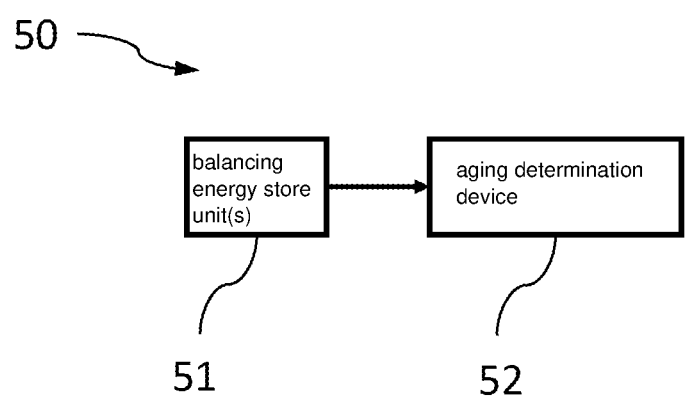
FIG. 5 shows a schematic illustration of an electrical energy store system according to the present invention according to one specific embodiment.

FIG. 5 shows a schematic illustration of an electrical energy store system 50 according to the present invention according to one specific embodiment. Electrical energy store system 50 includes at least two electrical energy store units 51 together with an associated balancing unit for balancing energy store units 51, the balancing unit not being illustrated here. In addition, electrical energy store system 50 includes a device 52 according to the present invention for determining at least one aging state of the at least two electrical energy store units.

What is claimed is:

1. A method for determining at least one aging state of a first plurality of electrical energy store units, the method comprising:
   a) ascertaining at least one of: (i) a number of balancing operations already carried out for the first plurality of electrical energy store units within a predefined first time interval, (ii) a total converted energy quantity during a balancing operation of the first plurality of electrical energy store units, and (iii) a first measure of dispersion of a particular state of charge-characterizing parameter of the first plurality of electrical energy store units;
   b) determining the at least one aging state of the first plurality of electrical energy store units as a function of at least one of: the number of balancing operations already carried out, the total converted energy quantity during the balancing operation, and the first measure of dispersion;
c) providing a reference model for determining the at least one aging state of the first plurality of electrical energy store units, the model including at least one relationship between at least one of: (i) the number of balancing operations already carried out, (ii) the total converted energy quantity during a balancing operation, and (iii) the first measure of dispersion, and the at least one aging state, wherein the determination of the at least one aging state in b) takes place using the reference model;
g) dividing a second plurality of electrical energy store units, which includes the first plurality, into clusters based on a variable characterizing utilization, including their charging throughput, each of the clusters including the first plurality of electrical energy store units;
h) correspondingly carrying out the steps for each of the clusters.

2. The method as recited in claim 1, wherein the first plurality of electric energy stores includes a battery pack.

3. The method as recited in claim 1, further comprising:
d) checking the need for a balancing operation, based on a second measure of dispersion of the parameters of the first plurality of electrical energy store units which characterize a particular state of charge; and
e) initiating the balancing operation as a function of the check in d).

4. The method as recited in claim 3, further comprising:
f) ascertaining the total converted energy quantity during the balancing operation of the first plurality of electrical energy store units at least as a function of a balancing resistance, a terminal voltage of the first plurality of electrical energy store units, and a duration of the balancing operation.

5. The method as recited in claim 1, wherein the first measure of dispersion is selected as the standard deviation.

6. The method as recited in claim 1, wherein the predefined first time interval and the reference model are different from cluster to cluster.

7. A device for determining at least one aging state of a first plurality of electrical energy store units, comprising:
an electronic control unit configured to perform the following:
a) ascertaining at least one of: (i) a number of balancing operations already carried out between the first plurality of electrical energy store units within a predefined first time interval, (ii) a total converted energy quantity during a balancing operation of the first plurality of electrical energy store units, and (iii) a first measure of dispersion of a particular state of charge-characterizing parameter of the first plurality of electrical energy store units;
b) determining the at least one aging state of the first plurality of electrical energy store units as a function of at least one of: the number of balancing operations already carried out, the total converted energy quantity during the balancing operation, and the first measure of dispersion;
c) providing a reference model for determining the at least one aging state of the first plurality of electrical energy store units, the model including at least one relationship between at least one of: (i) the number of balancing operations already carried out, (ii) the total converted energy quantity during a balancing operation, and (iii) the first measure of dispersion, and the at least one aging state, wherein the determination of the at least one aging state in b) takes place using the reference model;
g) dividing a second plurality of electrical energy store units, which includes the first plurality, into clusters based on a variable characterizing utilization, including their charging throughput, each of the clusters including the first plurality of electrical energy store units;
h) correspondingly carrying out the steps for each of the clusters.

8. A non-transitory machine-readable medium, on which is stored a computer program, which is executable by a processor, comprising:
a program code arrangement having program code for determining at least one aging state of a first plurality of electrical energy store units, by performing the following:
a) ascertaining at least one of: (i) a number of balancing operations already carried out for the first plurality of electrical energy store units within a predefined first time interval, (ii) a total converted energy quantity during a balancing operation of the first plurality of electrical energy store units, and (iii) a first measure of dispersion of a particular state of charge-characterizing parameter of the first plurality of electrical energy store units; and
b) determining the at least one aging state of the first plurality of electrical energy store units as a function of at least one of: the number of balancing operations already carried out, the total converted energy quantity during the balancing operation, and the first measure of dispersion;
c) providing a reference model for determining the at least one aging state of the first plurality of electrical energy store units, the model including at least one relationship between at least one of: (i) the number of balancing operations already carried out, (ii) the total converted energy quantity during a balancing operation, and (iii) the first measure of dispersion, and the at least one aging state, wherein the determination of the at least one aging state in b) takes place using the reference model;
g) dividing a second plurality of electrical energy store units, which includes the first plurality, into clusters based on a variable characterizing utilization, including their charging throughput, each of the clusters including the first plurality of electrical energy store units;
h) correspondingly carrying out the steps for each of the clusters.

9. An electrical energy store system, comprising:
at least two electrical energy store units;
a balancing unit to balance the energy store units; and
a device to determine at least one aging state of the electrical energy store units, including an electronic control unit configured to perform the following:
a) ascertaining: (i) a number of balancing operations already carried out for the electrical energy store units within a predefined first time interval, and/or (ii) a total converted energy quantity during a balancing operation of the electrical energy store units, and/or (iii) a first measure of dispersion of a particular state of charge-characterizing parameter of the electrical energy store units; and b) determining the at least one aging state of the electrical energy store units as a function of at least one of: the number of balancing operations already carried out, the total converted energy quantity during the balancing operation, and the first measure of dispersion;

c) providing a reference model for determining the at least one aging state of the first plurality of electrical energy store units, the model including at least one relationship between at least one of: (i) the number of balancing operations already carried out, (ii) the total converted energy quantity during a balancing operation, and (iii) the first measure of dispersion, and the at least one aging state, wherein the determination of the at least one aging state in b) takes place using the reference model;

g) dividing a second plurality of electrical energy store units, which includes the first plurality, into clusters based on a variable characterizing utilization, including their charging throughput, each of the clusters including the first plurality of electrical energy store units;

h) correspondingly carrying out the steps for each of the clusters.

* * * * *